United States Patent [19]

Ashida

[11] Patent Number: 5,802,464
[45] Date of Patent: Sep. 1, 1998

[54] BROADCAST OR COMMUNICATIONS RECEIVER INCLUDING CERAMIC FILTER, INTERMEDIATE FREQUENCY AMPLIFIER AND PASSIVE, NON-INDUCTIVE BAND-PASS FILTERS

[75] Inventor: Hiroyuki Ashida, Kyoto, Japan

[73] Assignee: Rohm Co., Ltd., Kyoto, Japan

[21] Appl. No.: 641,679

[22] Filed: May 1, 1996

Related U.S. Application Data

[63] Continuation of Ser. No. 272,946, Jul. 11, 1994, abandoned, which is a continuation of Ser. No. 103,086, Aug. 6, 1993, abandoned.

[30] Foreign Application Priority Data

Sep. 18, 1992 [JP] Japan .................... 4-249089

[51] Int. Cl.$^6$ ........................................ H04B 1/16
[52] U.S. Cl. .................... 455/339; 455/341; 330/306; 330/310
[58] Field of Search ........................ 455/307, 341, 455/339, 311; 330/302, 306, 310; 333/163, 168, 173, 175; 327/557, 558, 559

[56] References Cited

U.S. PATENT DOCUMENTS

| | | | |
|---|---|---|---|
| 3,571,740 | 3/1971 | Goncharoff . | |
| 3,585,529 | 6/1971 | Darlington | 455/109 |
| 3,717,816 | 2/1973 | Langer | 455/133 |
| 3,750,037 | 7/1973 | Schmidt | 327/558 |
| 3,936,777 | 2/1976 | Roccett et al. . | |
| 3,956,716 | 5/1976 | Waku et al. | 333/72 |
| 4,246,554 | 1/1981 | Swanson et al. | 333/192 |
| 4,327,332 | 4/1982 | Malchow | 455/341 |
| 4,479,249 | 10/1984 | Geesen et al. | 455/208 |
| 4,510,624 | 4/1985 | Thompson et al. | 455/311 |
| 4,588,956 | 5/1986 | de Corlieu et al. | 330/310 |
| 5,057,788 | 10/1991 | Ushida et al. | 330/310 X |
| 5,138,279 | 8/1992 | Kondo et al. | 330/306 X |
| 5,170,498 | 12/1992 | Oto | 455/190.1 |
| 5,245,300 | 9/1993 | Seasaki et al. | 333/167 |
| 5,263,192 | 11/1993 | Mittel et al. | 455/339 |
| 5,264,805 | 11/1993 | Yokozaki | 330/306 X |
| 5,276,917 | 1/1994 | Vanhanen et al. | 330/310 X |

OTHER PUBLICATIONS

Rizzi, Microwave Engineering—Passive Circuits, 1988 pp. 291–295, 462–463.

Primary Examiner—Edward F. Urban
Attorney, Agent, or Firm—Baker & Botts, L.L.P.

[57] ABSTRACT

The receiver includes a ceramic filter which is connected to the output side of a mixer circuit for limiting a band, an intermediate frequency amplifying circuit cascade connected to the output side of the ceramic filter in a plurality of intermediate frequency amplifying stages, and a plurality of passive band-pass filters connected between the respective intermediate frequency amplifying stages of the intermediate frequency amplifying circuit. Thereby, the receiver is able to reduce the size and costs thereof.

3 Claims, 5 Drawing Sheets

CHARACTERISTIC OF IF TRANSFORMER

CHARACTERISTIC OF CERAMIC FILTER

SYNTHESIZED CHARACTERISTIC

BROADCAST OR COMMUNICATIONS RECEIVER INCLUDING CERAMIC FILTER, INTERMEDIATE FREQUENCY AMPLIFIER AND PASSIVE, NON-INDUCTIVE BAND-PASS FILTERS

This application is a continuation of application Ser. No. 08/272,946, filed on Jul. 11, 1994, now abandoned, which is a continuation of application Ser. No. 08/103,086, filed Aug. 6, 1993, now abandoned.

BACKGROUND OF THE INVENTION

The present invention relates to an intermediate frequency amplifying circuit for use in a radio receiver, a wireless device, a television receiver or the like, and, in particular, to an improved circuit including a ceramic filter connected between a front end part and an intermediate frequency amplifying circuit.

In FIG. 8, there is shown a circuit diagram of a conventional intermediate frequency amplifying circuit for use in an FM receiver.

The mixing output of a mixer circuit 1 of an FM front end part is input to an intermediate frequency transformer 2 as an intermediate frequency signal of 10.7 MHz and this output is further output through a ceramic filter 3 to an intermediate frequency amplifying circuit 4 including 4–8 stages in total. Reference character 4a shown in FIG. 8 designates one stage of an intermediate frequency. In a circuit configuration shown in FIG. 8, the intermediate frequency transformer 2 is provided upstream of the ceramic filter 3 to restrict the spurious response of the ceramic filter 3. That is, a ceramic filter has a good characteristic in a pass band but it has a defect that it can often respond spuriously to other frequencies than the pass band frequencies. For this reason, in order to restrict such spurious response, there is provided the intermediate frequency transformer in front of the ceramic filter to thereby be able to restrict the spurious response in this position. This state is shown in FIGS. 9A to 9C. FIG. 9A shows a characteristic of the IF transformer, FIG. 9B shows a characteristic of the ceramic filter, and FIG. 9C shows a synthesized characteristic.

However, the intermediate frequency transformer has an inductance (L) component, which provides an obstacle to the size reduction of the intermediate frequency transformer and also always requires adjustment.

SUMMARY OF THE INVENTION

In view of the above, it is an object of the invention to provide a receiver including an intermediate frequency amplifying circuit which is able to restrict the spurious response of a ceramic filter even if the above-mentioned intermediate frequency transformer is not provided.

In FIG. 1, a circuit diagram of a receiver according to the present invention is shown.

A ceramic filter 3 is connected directly to the output side of a mixer circuit 1 of an FM front end part and the output of the ceramic filter 3 is guided to an intermediate frequency amplifying circuit (IF circuit) including a plurality of intermediate amplifying stages to which passive band-pass filters (BPFS) of 6 db/octaul are respectively inserted.

According to the receiver including the intermediate frequency amplifying circuit constructed in the above-mentioned manner, since the passive BPFs of 6 db/octaul are connected between the respective intermediate frequency amplifying stages, as the whole of the IF circuit, the characteristics of the respective BPFs are added together as shown in FIG. 2. As a result of this, as a whole, as shown in FIG. 8, there can be obtained a characteristic equivalent to that obtained when one piece of IF transformer 2 of LC is used. In this case, the respective BPFs are primary filters, that is, passive BPFs of 6 dB/octual and each of them does not include an inductance (L) component so that it can be constructed within an integrated circuit (IC).

DETAILED DESCRIPTION OF PREFERRED EMBODIMENTS

Figure 1:
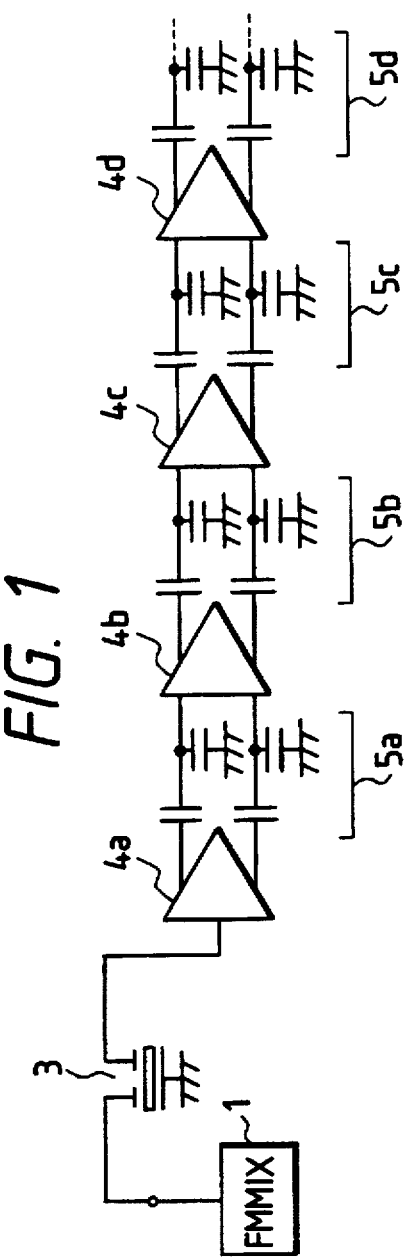
FIG. 1 is a circuit diagram of the structure of the invention.
Figure 3:
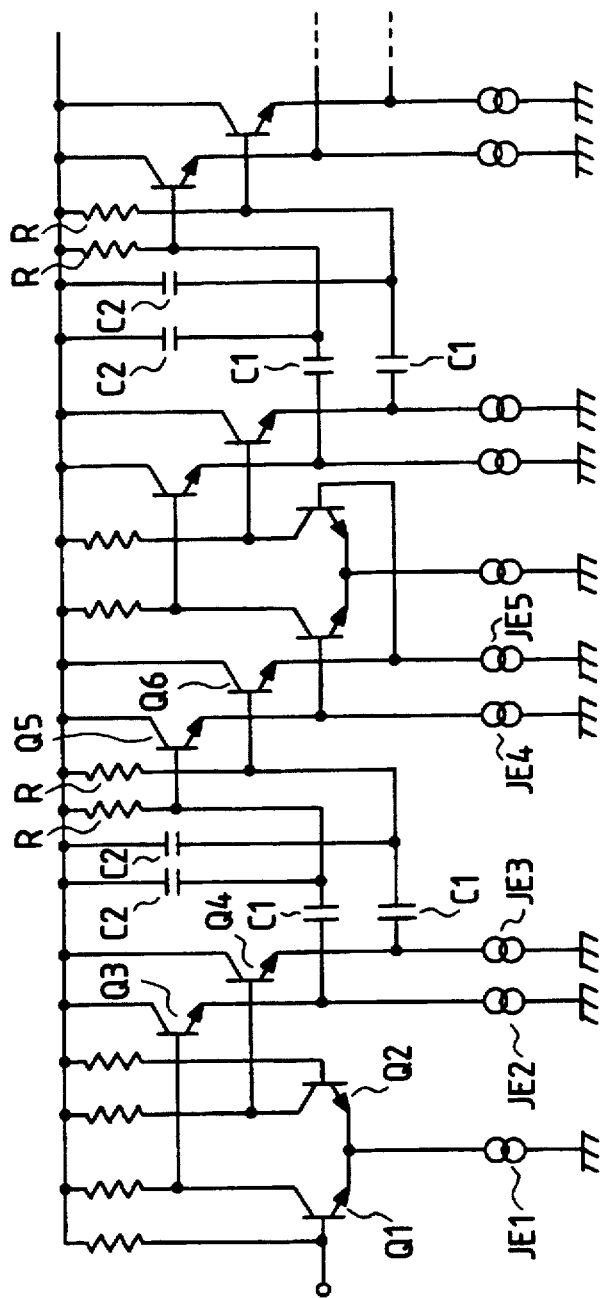
FIG. 3 is a circuit diagram of a first embodiment of a receiver according to the invention.

In FIG. 3, there is shown an intermediate frequency amplifying circuit of a first embodiment of a receiver according to the invention.

Figure 2:
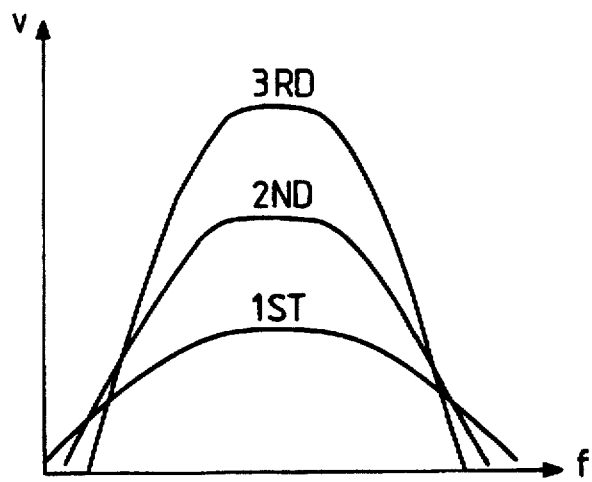
FIG. 2 is an explanatory view of the operation of the invention.
Figure 4:
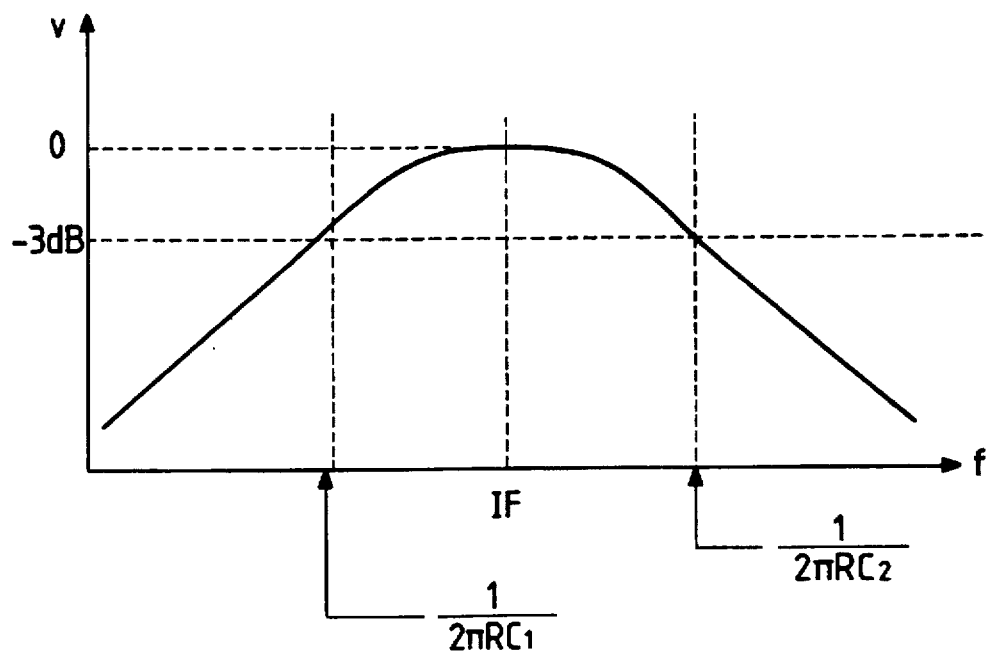
FIG. 4 is a BPF characteristic view of the first embodiment shown in FIG. 3.
Figure 9A:
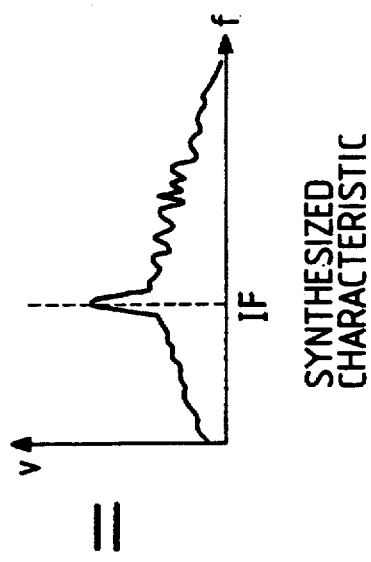
FIGS. 9A to 9C are views of the characteristics of the conventional receiver shown in FIG. 8.
Figure 9B:
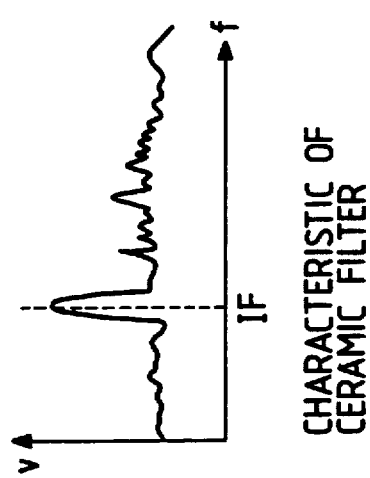
Figure 9C:
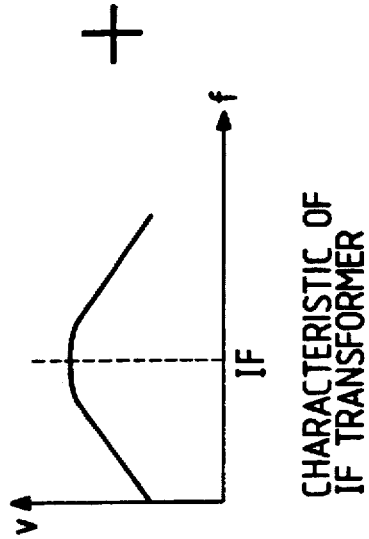

The outputs of differential amplifiers respectively composed of transistors Q1 and Q2 are received by buffer transistors Q3 and Q4 which are connected in an emitter-follower manner. A constant current source JE1 is connected to the common emitter of the differential amplifiers Q1 and Q2 and constant current sources JE2 and JE3 are connected to the emitters of the buffer transistors Q3 and Q4. Between each of the emitters of the transistors Q3, Q4 and corresponding buffer transistors Q5, Q6 which are provided downstream of the transistors Q3, Q4 and connected in an emitter-follower manner, a low frequency cutoff circuit which is a series circuit composed of a capacitor C1 and a resistance R as well as a high frequency cutoff circuit which is a parallel circuit composed of a capacitor C2 and the resistance R are connected to a positive signal line and a negative signal line, respectively. That is, the capacitor C1 is connected between the emitter of the transistor Q3 and the base of the transistor Q5 and the resistance R is connected between the base of the transistor Q5 and a power supply. Also, the capacitor C2 is connected between the base of the transistor Q5 and the power supply. Similarly, the capacitor C1 is connected between the emitter of the transistor Q4 and the base of the transistor Q6, while the capacitor C2 is connected between the base of the transistor Q6 and the power supply. The thus completed CR circuit forms a BPF (band-pass filter) which has a low-pass cutoff frequency of ½πRC1 and a high-pass cutoff frequency of ½πRC2. Characteristic of the BPF is as shown in FIG. 4. The transistors Q5 and Q6 respectively output signals to an IF (intermediate frequency) circuit disposed downstream of these transistors in an emitter-follower connection manner. Constant current sources JE4, JE5 are connected to the emitters of the transistors Q5, Q6, respectively. The thus structured passive BPFs are connected to IF stages, respectively. By cascade connecting a total of 3–4 IF stages, the combined BPF characteristic as shown in FIG. 2 can be obtained by the IF stages. Due to this, the spurious characteristic of the ceramic filter 3 to be connected in front of the IF stages can be restricted as shown in FIG. 9.

Figure 5:
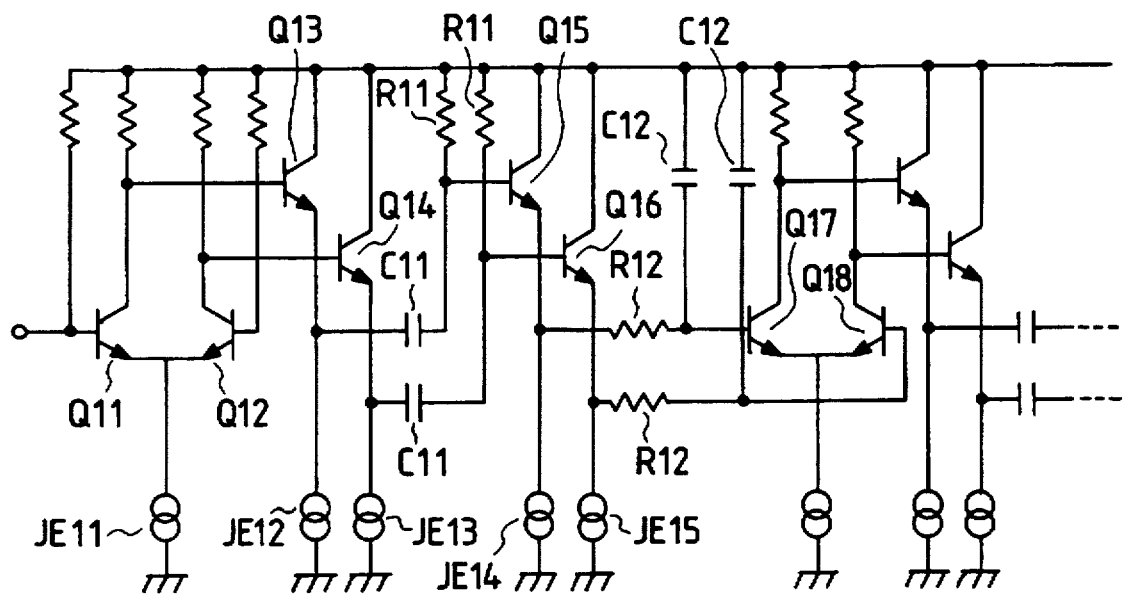
FIG. 5 is a circuit diagram of a second embodiment of a receiver according to the invention.

Second embodiment of the invention is described with reference to FIG. 5.

Figure 6:
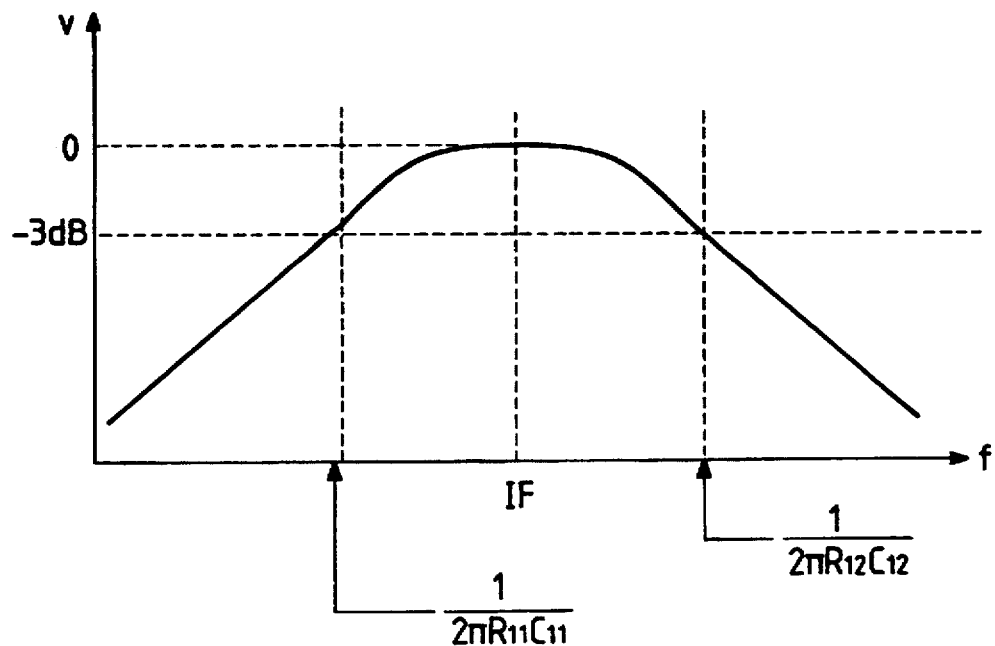
FIG. 6 is a BPF characteristic view of the second embodiment shown in FIG. 5.

Two transistors Q11 and Q12 form a differential amplifier, the output of which is received by two transistors Q13 and Q14 forming a buffer amplifier. A capacitor C11 is connected between the emitter of the transistor Q13 and the base of a transistor Q15, while a resistance R11 connected between the base of the transistor Q15 and a power supply. Also, the capacitor C11 is connected between the emitter of the transistor Q14 and the base of a transistor Q16, while the resistance R11 is connected between the base of the transistor Q16 and the power supply. Between the emitters of the transistors Q15, Q16 and transistors Q17, Q18 of the next IF stage, resistances R12 are connected, respectively, while capacitors C12 are respectively connected between the base of the transistors Q17, Q18 and the power supply. In this embodiment, between the transistors Q13 and Q15 as well as between the transistors Q14 and Q16, a low frequency cutoff is provided by the capacitor C11 and resistance R11. And, between the transistor Q15 and the transistor Q17, which is disposed downstream of Q15 and forms an IF amplifier, as well as between the transistor Q16 and the transistor Q18 which is disposed downstream of Q18 and forms another IF amplifier, a high frequency cutoff is provided by the resistance R12 and capacitor C12. In FIG. 6, the characteristic of one stage of the BPF according to the second embodiment of the invention is shown.

Figure 7:
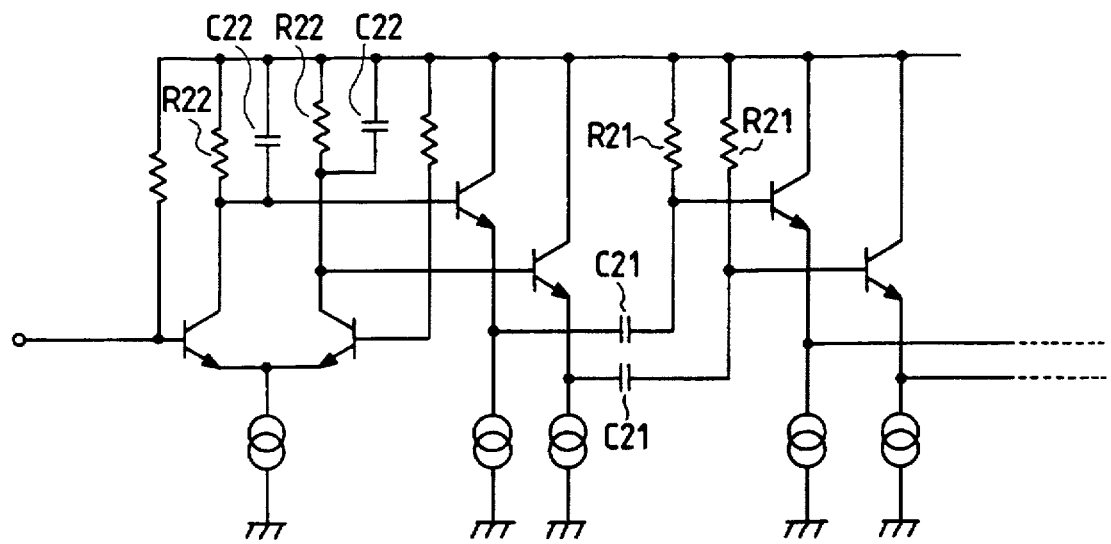
FIG. 7 is a circuit diagram of a third embodiment of a receiver according to the invention.
Figure 8:
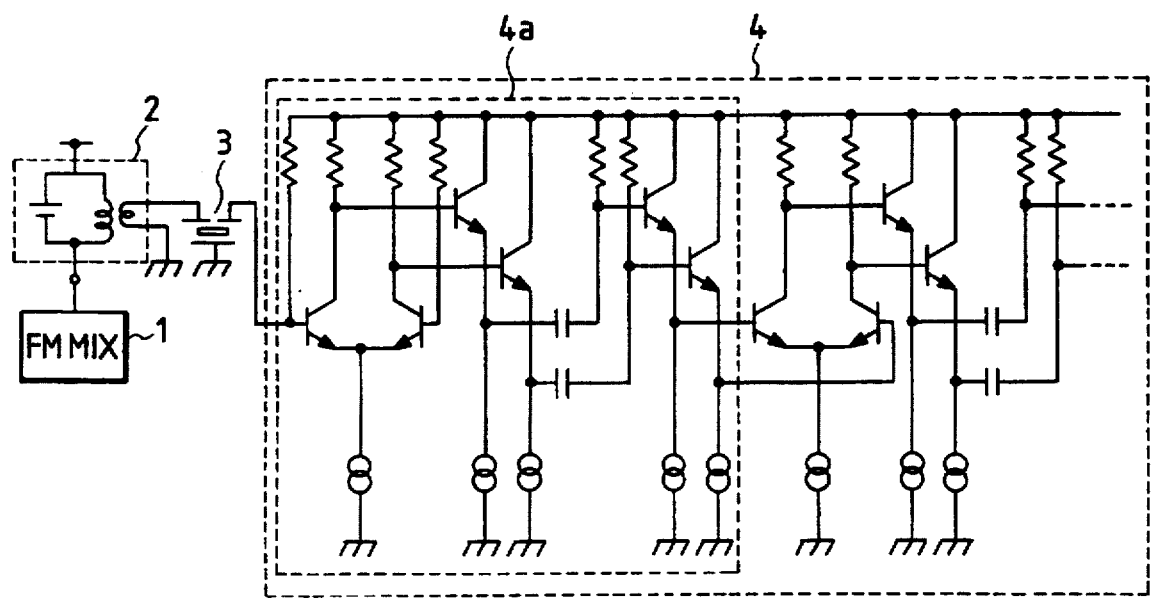
FIG. 8 is a circuit diagram of a conventional receiver.

In FIG. 7, third embodiment of the invention is shown, in which the characteristic of a BPF is the same as that shown in FIG. 6.

According to the present invention, even if an IFT (intermediate frequency transformer) is not provided, there can be obtained a ceramic filter spurious response restriction characteristic which is equivalent to that obtained when the IFT is provided. Since it does not require an L component such as an IFT or the like, the invention can be made in the form of an IC (integrated circuit). This makes it possible to reduce the size of the present receiver to a compact one, to reduce the cost thereof, and to save the time and labor for adjustment thereof.

What is claimed is:

1. A broadcast or communications receiver having an intermediate frequency amplifier comprising:
   a ceramic filter, connected to an output of a frequency conversion circuit, for limiting a frequency band contained within an intermediate frequency range;
   a plurality of intermediate frequency amplifying circuits which are cascade connected in a plurality of stages with an output of said ceramic filter; and
   a plurality of passive noninductive band-pass filters arranged to attenuate signals having frequencies above and below the frequency band of the ceramic filter respectively connected between said respective intermediate frequency amplifying stages, the band-pass filters and amplifying stages being in a semiconductor integrated circuit.

2. The receiver as claimed in claim 1, wherein said passive band-pass filter comprises:
   a low-frequency cutoff circuit which is a series circuit composed of a capacitor and a resistance, and
   a high-frequency cutoff circuit which is a parallel circuit composed of a capacitor and a resistance.

3. The receiver as claimed in claim 1 further comprising a plurality of buffer circuits respectively connected between said intermediate frequency amplifying circuits and said passive band-pass filters.

* * * * *